(12) United States Patent
Sun et al.

(10) Patent No.: US 9,006,110 B1
(45) Date of Patent: Apr. 14, 2015

(54) METHOD FOR FABRICATING PATTERNED STRUCTURE OF SEMICONDUCTOR DEVICE

(71) Applicant: United Microelectronics Corp., Hsin-Chu (TW)

(72) Inventors: Chien-Ying Sun, Tainan (TW); En-Chiuan Liou, Tainan (TW); Jia-Rong Wu, Kaohsiung (TW); Ching-Wen Hung, Tainan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/074,720

(22) Filed: Nov. 8, 2013

(51) Int. Cl.
*H01L 21/311* (2006.01)
*H01L 21/306* (2006.01)
*H01L 21/8234* (2006.01)
*H01L 21/308* (2006.01)

(52) U.S. Cl.
CPC .. *H01L 21/30604* (2013.01); *H01L 21/823431* (2013.01); *H01L 21/3083* (2013.01)

(58) Field of Classification Search
CPC ............................. H01L 29/785; H01L 21/845
USPC ........................ 438/703, 585; 257/368, 369
See application file for complete search history.

(56) References Cited

U.S. PATENT DOCUMENTS

| | | | | |
|---|---|---|---|---|
| 5,328,810 A | * | 7/1994 | Lowrey et al. | 430/313 |
| 2007/0170521 A1 | * | 7/2007 | Abadeer et al. | 257/401 |
| 2008/0057692 A1 | * | 3/2008 | Wells et al. | 438/597 |
| 2012/0280331 A1 | * | 11/2012 | Ou et al. | 257/401 |
| 2013/0122686 A1 | * | 5/2013 | Chang et al. | 438/429 |

OTHER PUBLICATIONS

Liang, Title of Invention: Fin-Shaped Structure Forming Process, U.S. Appl. No. 13/934,236, filed Jul. 3, 2013.

* cited by examiner

*Primary Examiner* — Mohammad Islam
*Assistant Examiner* — Christina Sylvia
(74) *Attorney, Agent, or Firm* — Winston Hsu; Scott Margo

(57) ABSTRACT

A method for fabricating a patterned structure of a semiconductor device includes: forming first mandrels and second mandrels on a substrate, wherein a first spacing is defined between the two adjacent first mandrels and a second spacing is defined between the two adjacent second mandrels, the first spacing being wider than the second spacing; forming a cover layer to cover the first mandrels while exposing the second mandrels; etching the cover layer and the second mandrels; removing the cover layer; concurrently forming first spacers on the sides of the first mandrels and a second spacers on the sides of the second mandrels after removing the cover layer; and transferring a layout of the first and second spacers to the substrate so as to form fin-shaped structures.

17 Claims, 6 Drawing Sheets

METHOD FOR FABRICATING PATTERNED STRUCTURE OF SEMICONDUCTOR DEVICE

BACKGROUND OF THE INVENTION

1. Field of the Invention

The present invention relates generally to the field of patterned structures used in semiconductor devices, and more particularly to a method for fabricating fin-shaped structures with equal widths.

2. Description of the Prior Art

Field effect transistors are important electronic devices in the fabrication of integrated circuits. As the sizes of the semiconductor devices becomes smaller and smaller, the fabrication of the transistors also has to be improved so as to fabricate transistors with smaller sizes and higher quality.

With the increasing miniaturization of the semiconductor devices, various multi-gate MOSFET devices having fin-shaped structures have been developed. The multi-gate MOSFET is advantageous for the following reasons. First, the manufacturing processes of the multi-gate MOSFET devices can be integrated into the conventional logic device processes, and thus are more compatible. In addition, since the three-dimensional (3-D) structure of the multi-gate MOSFET increases the overlapping area between the gate and the substrate, the channel region is controlled more effectively. This therefore reduces the drain-induced barrier lowering (DIBL) effect and the short channel effect.

Generally, the fin-shaped structures of the multi-gate MOSFET cannot be defined directly through conventional photolithography processes. Thus, an auxiliary process, such as a sidewall image transfer (SIT) process is often adopted by the semiconductor manufacturers to define these fin-shaped structures. However, there is still a drawback resulting from the SIT process. For example, the fin-shaped structures within different regions, such as logic regions and memory regions, often have different widths due to different pattern densities. The variations in the widths of the fin-shaped structures adversely affect the performance of the transistors in these regions. Therefore, there is still a need to provide a method for fabrication patterned structures of semiconductor devices in order to overcome the above-mentioned drawback.

SUMMARY OF THE INVENTION

One object of the present invention is to provide a method for fabricating a patterned structure of a semiconductor device, which can eliminate the variations in the widths of fin-shaped patterns formed within different regions.

To this end, a method for fabricating a patterned structure of a semiconductor device is provided, which includes: forming first mandrels and second mandrels on a substrate, wherein a first spacing is defined between the two adjacent first mandrels and a second spacing is defined between the two adjacent second mandrels, the first spacing being wider than the second spacing; forming a cover layer to cover the first mandrels while exposing the second mandrels; etching the cover layer and the second mandrels; removing the cover layer; concurrently forming first spacers on the sides of the first mandrels and a second spacers on the sides of the second mandrels after removing the cover layer; and transferring a layout of the first and second spacers to the substrate.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

DETAILED DESCRIPTION

Figure 1:
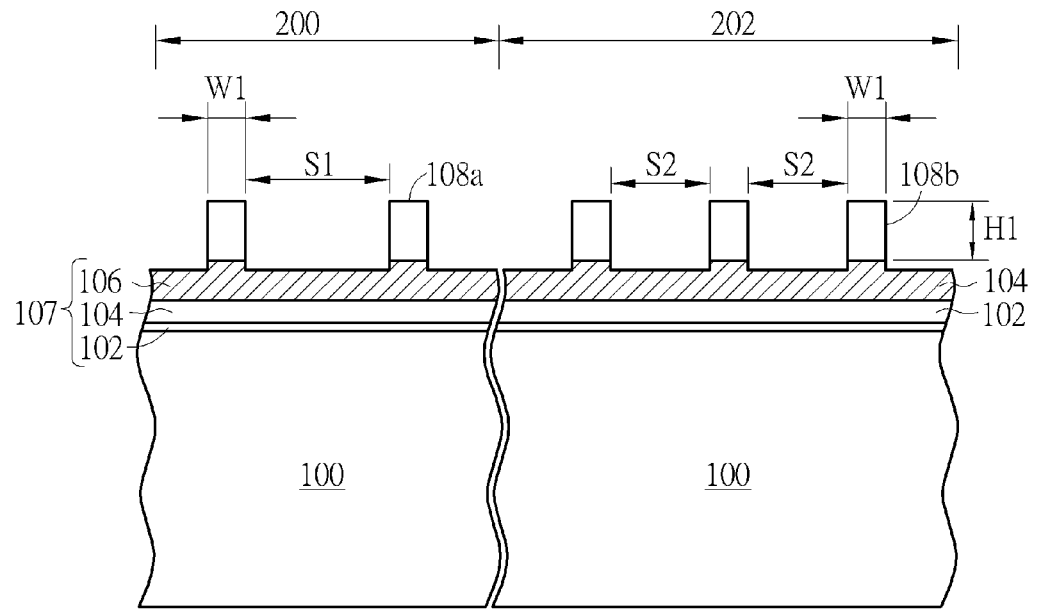
FIG. 1 to FIG. 5 are schematic diagrams showing a method for fabricating patterned structures according to a first embodiment of the present invention.

In the following description, numerous specific details are given to provide a thorough understanding of the invention. It will, however, be apparent to one skilled in the art that the invention may be practiced without these specific details. Furthermore, some well-known system configurations and process steps are not disclosed in detail, as these should be well-known to those skilled in the art.

Likewise, the drawings showing embodiments of the apparatus are not to scale and some dimensions are exaggerated for clarity of presentation. Also, where multiple embodiments are disclosed and described as having some features in common, like or similar features will usually be described with same reference numerals for ease of illustration and description thereof.

Figure 6:
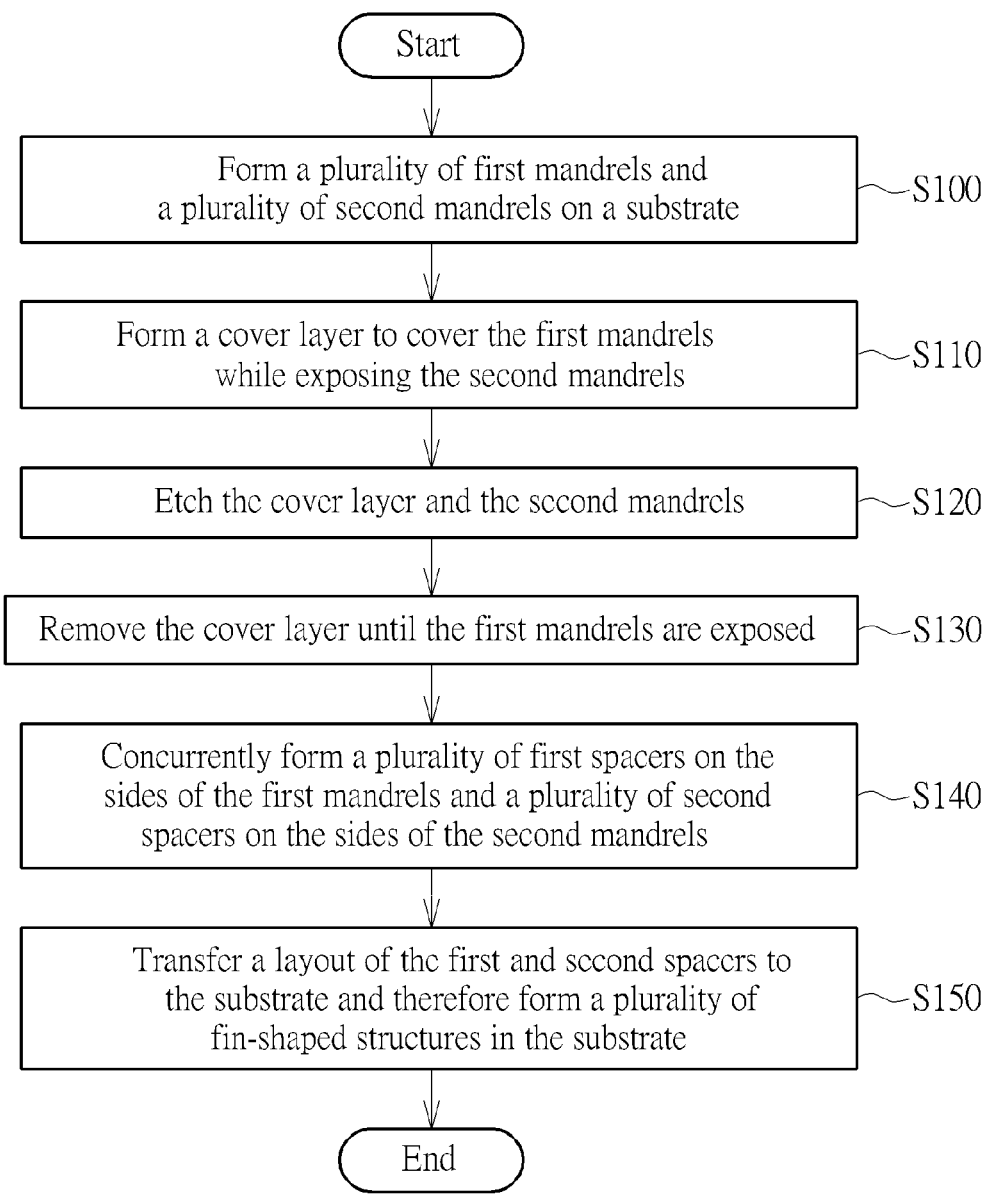
FIG. 6 is a simplified flow chart illustrating a method for fabricating patterned structures according to a first embodiment of the present invention.

Please refer to FIG. 1 to FIG. 6. FIG. 1 to FIG. 5 are schematic diagrams showing a method for fabricating patterned structures according to a first embodiment of the present invention. FIG. 6 is a simplified flow chart illustrating a method for fabricating patterned structures according to a first embodiment of the present invention. Referring to FIG. 1, in step S100, several first mandrels 108a and second mandrels 108b are formed on a substrate 100 at the beginning of the fabrication process. Specifically, the substrate 100 may be divided into at least two regions, e.g. a first region 200 and a second region 202, in which the first mandrels 108a and the second mandrels 108b are respectively formed. Preferably, the first region 200 is a low density region used to accommodate sparse patterned structures while the second region 202 is a high density region used to accommodate dense patterned structures. The first region 200 and the second region 202 may be chosen from logic region, input/output (I/O) region, core region, memory region, analog region, and other circuitry regions. For example, the first region 200 may be a logic region and the second region 202 is a memory region, but not limited thereto. Furthermore, in order to fabricate patterned structures with different densities, the mandrels formed on the substrate may be designed correspondingly to have different spacing. For example, the first mandrels 108a in the first region 200 may be designed to have first spacing S1 and the second mandrels 108b in the second region 202 may be designed to have second spacing S2. Preferably, the first spacing S1 is wider than the second spacing S2. In other words, the first mandrels 108a may constitute a low density pattern and the second mandrels 108b may constitute a high density pattern. Besides, all the first mandrels 108a and the second mandrels 108/b may be designed to have equal widths W1 and heights H1, but not limited thereto.

In detail, the process for fabricating the above-mentioned first mandrels 108a and the second mandrels 108b may include the following steps. First, as shown in FIG. 1, a continuous layer (not shown) having a first height H1 is formed on the substrate 100, which is used to construct the main portions of the first mandrels 108a and the second mandrels 108b. In detail, the substrate 110 may be a semiconductor substrate, such as a silicon substrate, a silicon containing substrate, a III-V group-on-silicon (such as GaN-on-silicon) substrate, a graphene-on-silicon substrate or a silicon-on-insulator (SOI) substrate, but not limited thereto. Besides, the continuous layer may have a single-layered structure or a multi-layered structure composed of one or more materials, such as semiconductor materials, organic materials or dielectric materials, depending upon the needs. Preferably, the continuous layer is made of polysilicon. Optionally, there may be other layers disposed between the continuous layer and the substrate. For example, a multi-layered structure, including an interfacial layer 102, a bottom hard mask 104 and a top hard mask 106, is formed on the substrate 100 before the formation of the continuous layer. Specifically, the compositions of the interfacial layer 102, the bottom hard mask 104 and the top hard mask 106 may respectively correspond to silicon oxide, silicon nitride and silicon oxide, but not limited thereto. Depending on different requirements, the multi-layered structure may also be omitted or replaced by a single-layered structure.

Still referring to FIG. 1, after the formation of the continuous layer, a photolithography and etching process is carried out to define the dimensions and positions of the first mandrels 108a and the second mandrels 108b. For example, is carried out to define the dimensions and positions of the first mandrels 108a and the second mandrels 108b, a patterned photoresist (not shown) may be formed on the continuous layer first. Then, an etching process is carried out to transfer patterns from the patterned photoresist to the continuous layer. Afterwards, the patterned photoresist is removed and the first mandrels 108a and the second mandrels 108b as depicted in FIG. 1 are therefore formed. Thereafter, an optional trimming process can be performed to further trim the first mandrel 108a or/and the second mandrel 108b, such as a dry etching process, but not limited thereto. It should be noted that, as depicted in FIG. 1, the top hard mask 104 not covered by the patterned photoresist may also be slightly etched during the transferring process, but not limited thereto.

Figure 2:
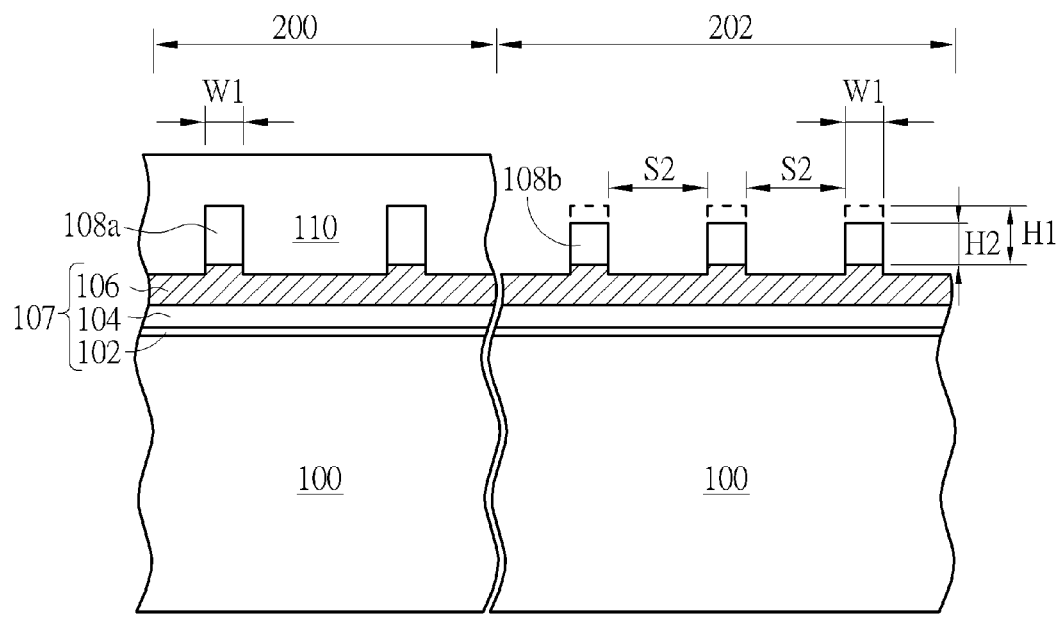
Figure 3:
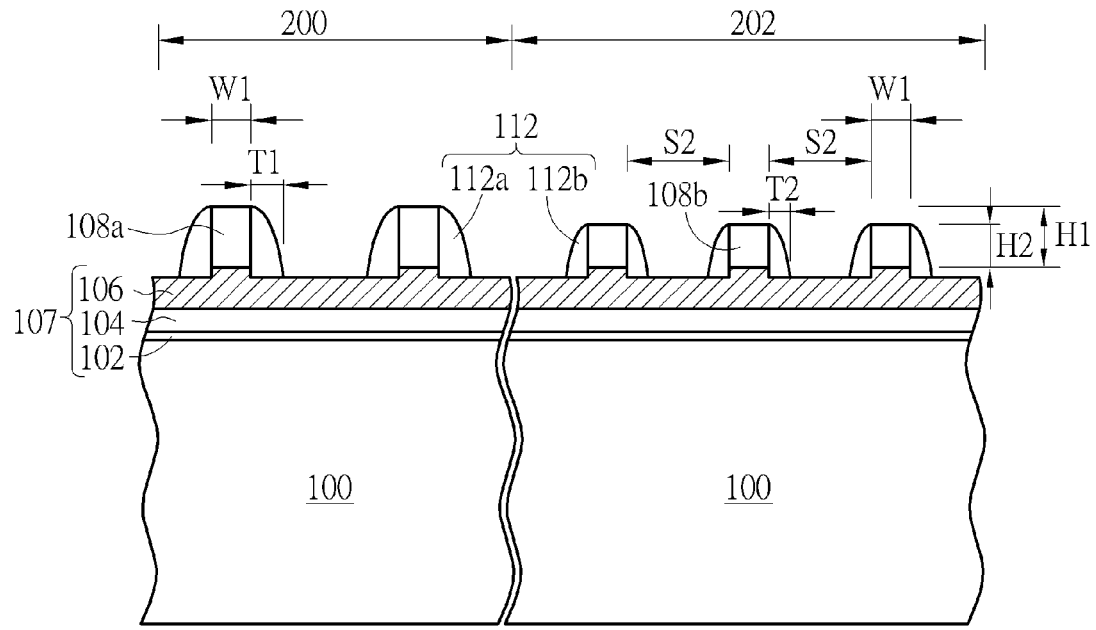
Figure 4:
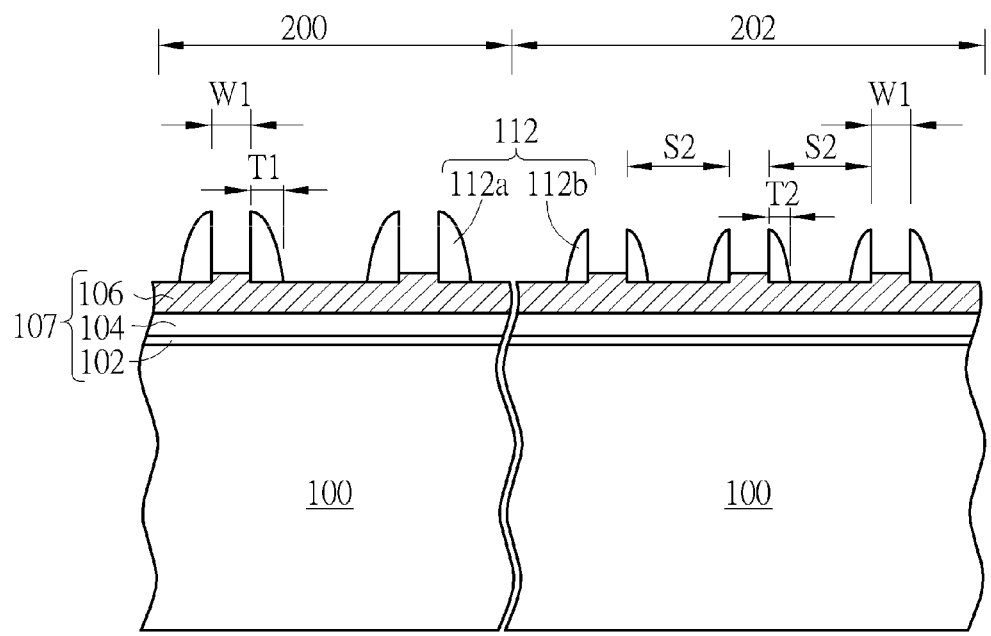
Figure 5:
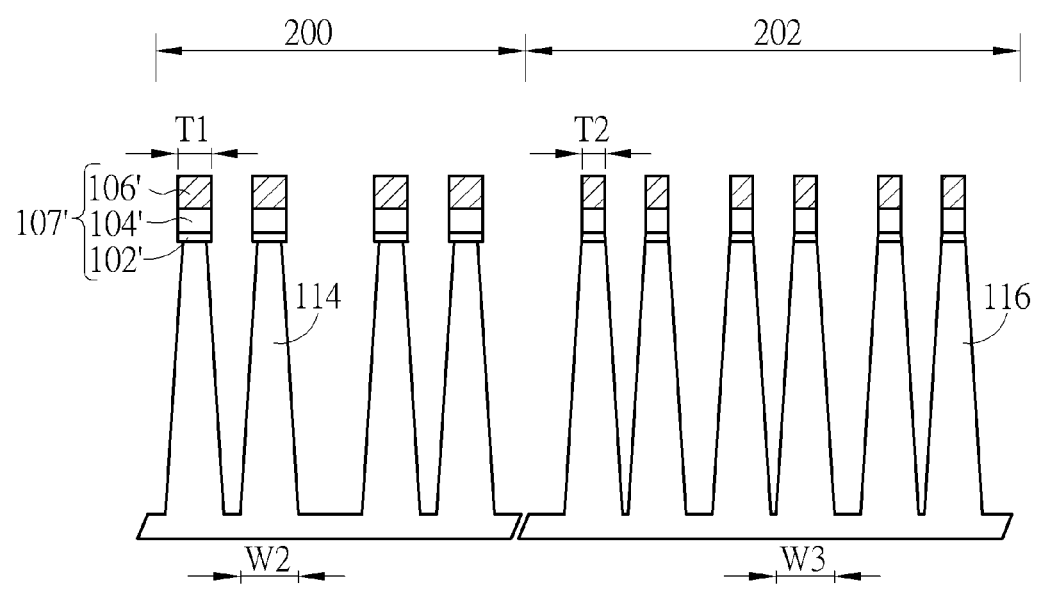

Please refer to FIG. 2. After the formation of the first mandrel 108a and the second mandrel 108b, in step S110, a cover layer 110 is then formed to cover all of the first mandrels 108a within the first region 200 and expose the second mandrels 108b within the second region 202. Specifically, the cover layer 110 may be made of any material that has different etching selectivity to the first mandrels 108a and the second mandrels 108b. Preferably, the cover layer 110 may be made of a light sensitive material, i.e. photoresist, but not limited thereto. Afterwards, in step S120, an anisotropic etching process, such as a dry etching process, is carried out to remove portions of the second mandrel 108b. In one case, portions of the cover layer 110 may also be removed at the same time. Specifically, the heights of the second mandrels 108b are reduced from the initial heights H1 to modified heights H2 during the anisotropic etching process. During the etching process, only the heights of the second mandrels 108b are reduced and the heights of the first mandrels 108a preferably remain the same.

Then, in step S130, the cover layer 110 is removed after the above etching process. Please refer to FIG. 3. A spacer material (not shown) is formed to entirely cover the first mandrel 108a, the second mandrel 108b and the substrate 110. At this processing stage, since the spacer material is conformally deposited on the first mandrel 108a and the second mandrel 108b, the spacer material within the first region 200 and the second region 202 preferably has a uniform thickness. Precisely, the composition of the first spacer material may be different from that of the mandrels 108a and 108b, the top hard mask 106, the bottom hard mask 104, the interfacial layer 102, and the substrate 100. Preferably, the spacer material is silicon nitride or silicon carbide, but not limited thereto. Afterwards, in step S140, a blank etching process is carried out until the top hard mask 106 is exposed. During this process, first spacers 112a and second spacers 112b are respectively formed on the sides of the first mandrels 108a and on the sides of the second mandrels 108b. It should be noted that, since the thicknesses of the spacers 112 are generally proportional to the heights of the corresponding mandrels 108a and 108b, the spacers 112a within the first region 200 may have a thickness thicker than the spacers 112b within the second region 202. More precisely, the spacers 112a within the first region 200 have a first thickness T1 while the spacers 112b within the second region 202 have a second thickness T2. In this case, the first thickness T1 is thicker than the second thickness T2 due to a fact that the heights H1 of the first mandrels 108a are higher than the height H2 of the second mandrels 108b. Subsequently, referring to FIG. 4, the first mandrels 108a and the second mandrels 108b are removed through suitable etching process, such as a wet etching process, until the underlying top hard mask 106 is exposed.

After the removal of the first mandrels 108a and the second mandrels 108b, the pattern defined by the spacers 112 may be then sequentially transferred to the top hard mask 106, bottom hard mask 104, and the interfacial layer 102 so as to form a patterned hard mask, but not limited thereto. Afterwards, the spacers 112 may be removed. Please refer to FIG. 5. After the above transferring process, the patterned hard mask 107' is formed on the substrate 100. It should be noted that, because a layout of the patterned hard mask 107' corresponds to that of the pacers 112, the patterned hard mask 107' within the first region 200 may have a width with a value equal to that of the first thickness T1 while the patterned hard mask 107' within the second region 202 may have a width with a value equal to that of the second thickness T2. As a result, the width of the patterned hard mask 107' within the first region 200 is wider than that of the patterned hard mask 107' within the second region 202. Afterwards, the layout of the patterned hard mask 107' is transferred to the underlying substrate 100. In this way, first fin-shaped structures 114 are formed in the first region 200 and the second fin-shaped structures 116 are formed in the second region 202. It should be noted that, because etching rate of the substrate 100 in the low density region 200 is often higher than that in the high density region 202 (also called loading effect), the widths W2 of the first fin-shaped structures 114 may be almost equal to the widths W3 of the second fin-shaped structures 116 even though the patterned hard mask 107' used to define the fin-shaped structures 114 and 116 has different widths. Thereafter, a trimming process may be further performed on the first fin-shaped structures 114 or/and the second fin-shaped structures 116 to further reduce their widths, but it is not limited thereto. Other processes may be performed to improve the structure or the performance thereof.

Afterwards, other related semiconductor fabricating processes may be further carried out. For example, the patterned hard mask may be removed completely until the first fin-shaped structures and the second fin-shaped structures are exposed. Then, a shallow trench isolation (STI) is formed to surround the lower portions of the first fin-shaped structures and the second fin-shaped structures. A process for fabricating gates is then carried out so that portions of the fin-shaped structures may be covered by the corresponding gate structures. As a result, a required device may be obtained, such as a CMOS formed within the first region and a SRAM structure with six FETs (6T-SRAM) formed within the second region. Since the process for fabricating gates is well-known to those skilled in the art, its description is therefore omitted for the sake of clarity.

In the following paragraphs, one modification according to the first embodiment of the present invention is disclosed. For the sake of clarity, only the main difference between the modification and the first preferred embodiment is described, the same or similar processes or structures may refer back to previously described first preferred embodiment.

Figure 7:
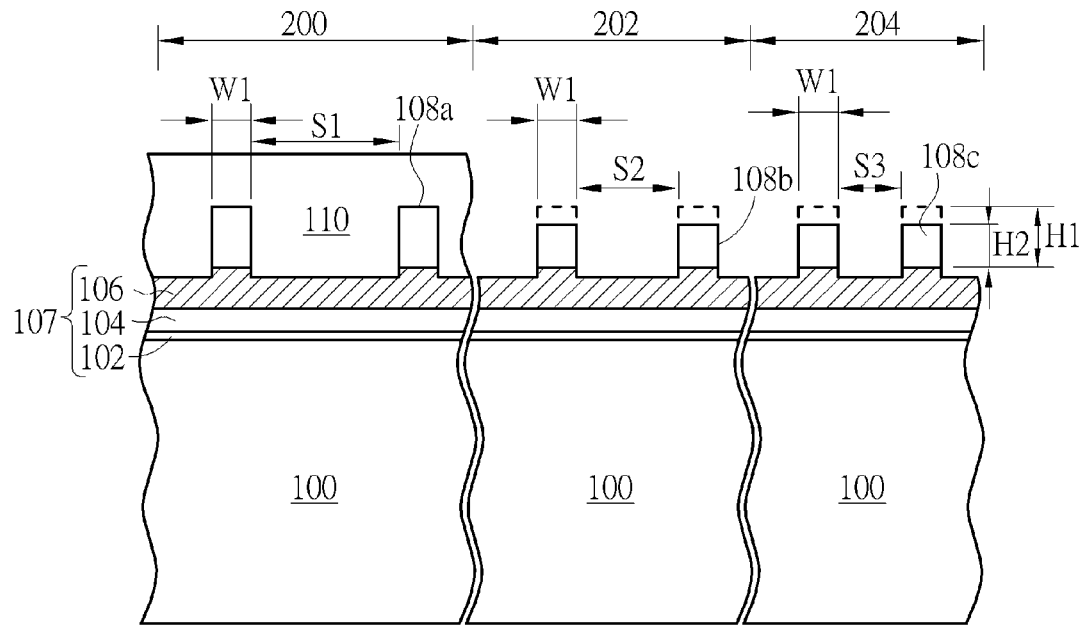
FIG. 7 to FIG. 9 are schematic diagrams showing a method for fabricating patterned structures according a modification of the present invention.
Figure 8:
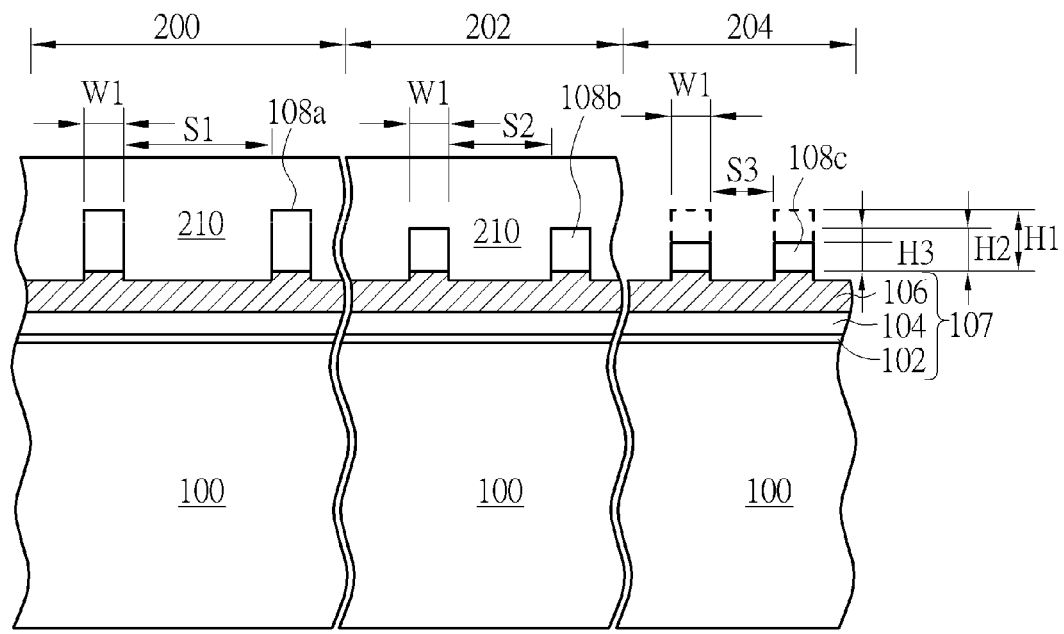
Figure 9:
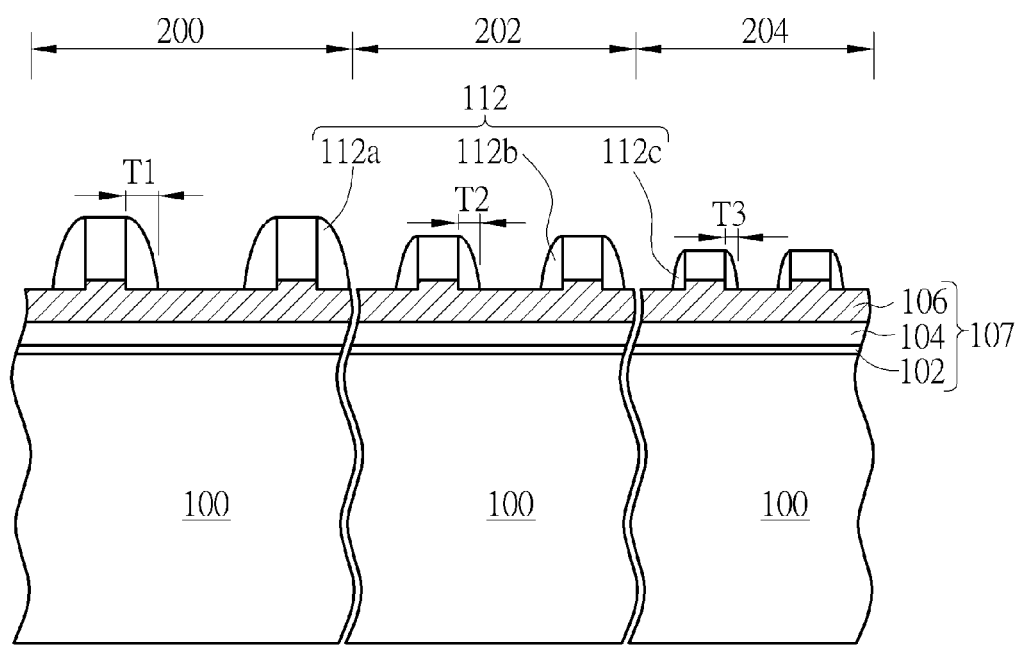

Please refer to FIG. 7 to FIG. 9. FIG. 7 to FIG. 9 are schematic diagrams showing a method for fabricating patterned structures according a modification of the present invention. Processes disclosed in this modification are similar to those disclosed in the previous embodiment. However, one main difference between these two embodiments is that the substrate 100 is further defined with a third region 204 in accordance with this modification. Referring to FIG. 7, similar to FIG. 2, the substrate 100 may be divided into at least three regions, e.g. the first region 200, the second region 202 and the third region 204, in which the first mandrels 108a, the second mandrels 108b and the third mandrels 108c are respectively formed. Preferably, the first region 200 is a low density region used to accommodate sparse patterned structures, the second region 202 is a moderate density region used to accommodate relatively dense patterned structures, and the third region 204 is a high density region used to accommodate dense patterned structures. For example, the first region 200 may be a logic region, the second region 202 is a non-volatile memory region, and the third region 204 is a volatile memory region, but not limited thereto. Furthermore, in order to fabricate patterned structures with different densities, the mandrels formed on the substrate may be designed correspondingly to have different spacing. For example, the first mandrels 108a in the first region 200 may be designed to have first spacing S1, the second mandrels 108b in the second region 202 may be designed to have second spacing S2, and the third mandrels 108c in the third region 204 may be designed to have third spacing S3. Preferably, the first spacing S1 is wider than the second spacing S2 and the third spacing S3, and the second spacing S2 is wider than the third spacing S3. In other words, the first mandrels 108a may constitute a low density pattern, the second mandrels 108b may constitute a moderate density pattern, and the third mandrels 108c may constitute a high density pattern. Besides, all the first mandrels 108a, the second mandrels 108b, and the third mandrels 108c may be designed to have equal widths W1 and heights H1, but not limited thereto.

Still referring to FIG. 7, similar to FIG. 2, after the formation of the first mandrel 108a, the second mandrel 108b, and the third mandrel 108c, a cover layer 110 is then formed to cover all of the first mandrels 108a within the first region 200 and expose the second mandrels 108b and the third mandrels 108c respectively within the second region 202 and the third region 204. Afterwards, the anisotropic etching process is carried out to remove portions of the second mandrel 108b and the third mandrel 108c. Specifically, both the heights of the second mandrels 108b and the third mandrel 108c are reduced from the initial heights H1 to modified heights H2 during the anisotropic etching process.

Then, the cover layer 110 is removed after the above etching process. Please refer to FIG. 8. Another cover layer 210 is formed to cover the first mandrels 108a and the second mandrel 108b and expose the third mandrels 108c within the third region 204. Afterwards, a similar anisotropic etching process is carried out to remove portions of the third mandrels 108c within the third region 204. In one case, portions of the cover layer 210 may also be removed at the same time. Specifically, the heights of the third mandrels 108c are further reduced from the heights H2 to heights H3 during this anisotropic etching process. During the etching process, only the heights of the second mandrels 108b are reduced.

Please refer to FIG. 9. Similar to FIG. 3, the spacer material (not shown) is also formed to entirely cover the first mandrel 108a, the second mandrel 108b, the third mandrel 108c and the substrate 110. At this processing stage, since the spacer material is conformally deposited on the first mandrel 108a, the second mandrel 108b, and the third mandrel 108c, the spacer material within the first region 200, the second region 202, and the third region 204 preferably has a uniform thickness. Afterwards, a blank etching process is carried out until the top hard mask 106 is exposed. During this process, first spacers 112a, second spacers 112b, and third spacers 112c are respectively formed on the sides of the first mandrels 108a, on the sides of the second mandrels 108b, and on the sides of the third mandrels 108c. Similarly, since the thickness of the spacers 112 is generally proportional to the heights of the corresponding mandrels 108a, 108b and 108c, the spacers 112a within the first region 200 may have a thickness thicker than that of the spacers 112b within the second region 202. Specifically, the spacers 112a within the first region 200 have the first thickness T1, the pacers 112b within the second region 202 have the second thickness T2, and the spacers 112c within the third region 204 have a third thickness T3. In this case, the first thickness T1 is thicker than the second thickness T2 due to a fact that the heights H1 are higher than the heights H2 and H3. In the following processes, the layout defined by the spacers 112 is also transferred to the substrate 100 through the similar processes disclosed in FIG. 4 and FIG. 5. Those processes are omitted for the sake of clarity.

To summarize, the embodiments of the present invention provide a method for fabricating a patterned structure of a semiconductor device. The heights of mandrels within different regions, e.g. high density region and low density region, are correspondingly modified so that all fin-shaped structures within different regions may have the same width. As a result, the performance of the semiconductor devices within these regions may be well-controlled.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a patterned structure of a semiconductor device, comprising:
    forming a plurality of first mandrels and a plurality of second mandrels on a substrate, wherein a first spacing is defined between the two adjacent first mandrels and a second spacing is defined between the two adjacent second mandrels, the first spacing being wider than the second spacing, and the widths of the first mandrels are equal to the widths of the second mandrels;

forming a cover layer to cover the first mandrels while exposing the second mandrels;

etching the exposed second mandrels;

removing the cover layer;

concurrently forming a plurality of first spacers on the sides of the first mandrels and a plurality of second spacers on the sides of the second mandrels after removing the cover layer; and transferring a layout of the first and second spacers to the substrate, so as to form a plurality of fin-shaped structures.

2. The method according to claim 1, wherein the first mandrels constitute a low density pattern and the second mandrels constitute a high density pattern.

3. The method according to claim 1, wherein the cover layer is a photoresist layer.

4. The method according to claim 1, wherein a step for etching the cover layer and the second mandrels comprises an anisotropic etching process.

5. The method according to claim 1, wherein a step for forming the first spacers and the second spacers comprises:

forming a spacer material to entirely cover the first mandrels, the second mandrel, and the substrate; and etching the spacer material.

6. The method according to claim 1, wherein the widths of the first spacers are greater than the widths of the second spacers.

7. The method according to claim 1, further comprising forming a mask layer on the substrate before forming the first mandrels and the second mandrels.

8. The method according to claim 7, further comprising transferring the layout of the first and second spacers to the mask layer, and then transferring the layout of the mask layer to the substrate.

9. The method according to claim 1, wherein the widths of the fin-shaped structures are all equal.

10. The method according to claim 1, further comprising:

forming a plurality of third mandrels on the substrate during a step for forming the first and second mandrels, wherein a third spacing is defined between the two adjacent third mandrels, the third spacing being narrower than the first spacing and the second spacing;

forming another cover layer to cover the first mandrels and the second mandrels while exposing the third mandrels;

etching the exposed third mandrels;

concurrently forming a plurality of third spacers on the sides of the third mandrels during a step for forming the first spacers and the second spacers; and transferring a layout of the first, second, and third spacers to the substrate.

11. The method according to claim 10, wherein the widths of the first, the second, and the third mandrels are all equal.

12. The method according to claim 10, wherein the first mandrels constitute a low density pattern, the second mandrels constitute a moderate density pattern, and the third mandrels constitute a high density pattern.

13. The method according to claim 10, wherein the widths of both the first and the second spacers are greater than the widths of the third spacers.

14. The method according to claim 10, wherein a step for forming the third spacers comprises:

forming a spacer material to entirely cover the first mandrels, the second mandrel, the third mandrel, and the substrate; and etching the spacer material until the substrate is exposed.

15. The method according to claim 10, further comprising forming a mask layer on the substrate before forming the first mandrels, the second mandrels and the third mandrels.

16. The method according to claim 10, further comprising transferring the layout of the first, second and third spacers to the mask layer.

17. The method according to claim 10, wherein the widths of the fin-shaped structures are all equal.

* * * * *